United States Patent [19]

Fahling

[11] 4,360,858

[45] Nov. 23, 1982

[54] INSTRUMENT PANEL ASSEMBLY WITH CONDUCTIVE ELASTOMERIC CONNECTORS

[75] Inventor: Waldo C. Fahling, Fenton, Mich.

[73] Assignee: General Motors Corporation, Detroit, Mich.

[21] Appl. No.: 224,847

[22] Filed: Jan. 14, 1981

[51] Int. Cl.³ .......................... H05K 7/12; H05K 1/08
[52] U.S. Cl. ..................................... 361/380; 361/398; 361/403; 361/413; 339/17 CF
[58] Field of Search ................... 174/52 R, 52 FP, 50, 174/54; 310/344, 365, 366; 339/17 CF; 361/380, 395, 399, 400, 403, 410, 413, 422, 424, 356, 358

[56] References Cited

U.S. PATENT DOCUMENTS 3,885,173  5/1975  Lee ................................. 339/17 CF
3,911,234  10/1975  Kotaka ............................. 361/398

Primary Examiner—G. P. Tolin
Attorney, Agent, or Firm—Warren D. Hill

[57] ABSTRACT

Electrical gauges requiring a calibration resistor connected between at least two of its terminals is mounted in an instrument panel assembly with the terminals connected to printed circuit conductors. The instrument panel has a housing carrying a printed circuit on its inner surface. An elastomeric electrical connector comprising an insulating body with selected resilient conductive regions is arranged with respect to the calibration resistor, the instrument terminals and the printed circuit to complete the proper circuit connections when the gauge is mounted in the instrument panel with its terminals urged toward the housing.

4 Claims, 6 Drawing Figures

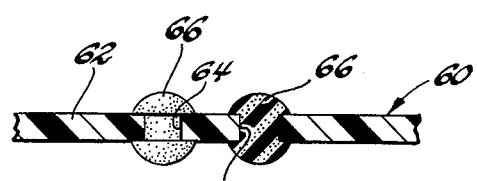
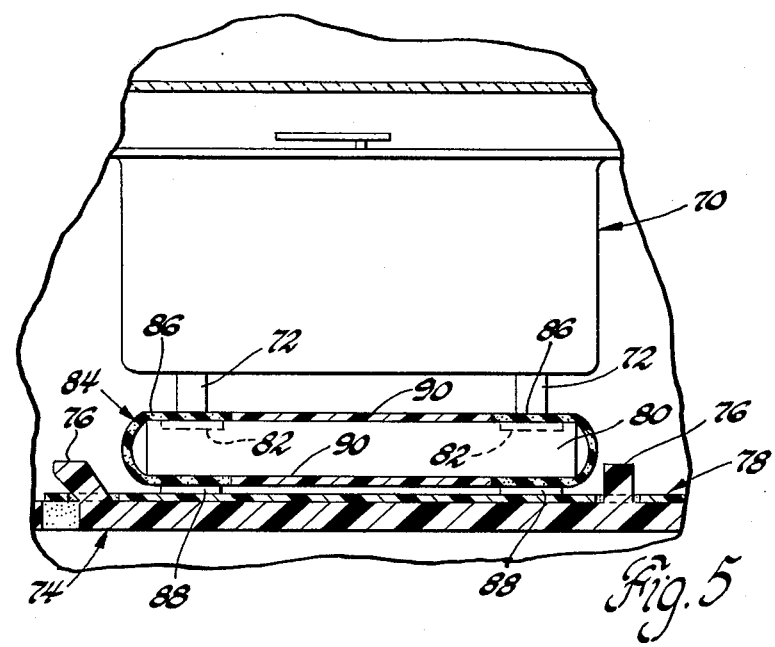
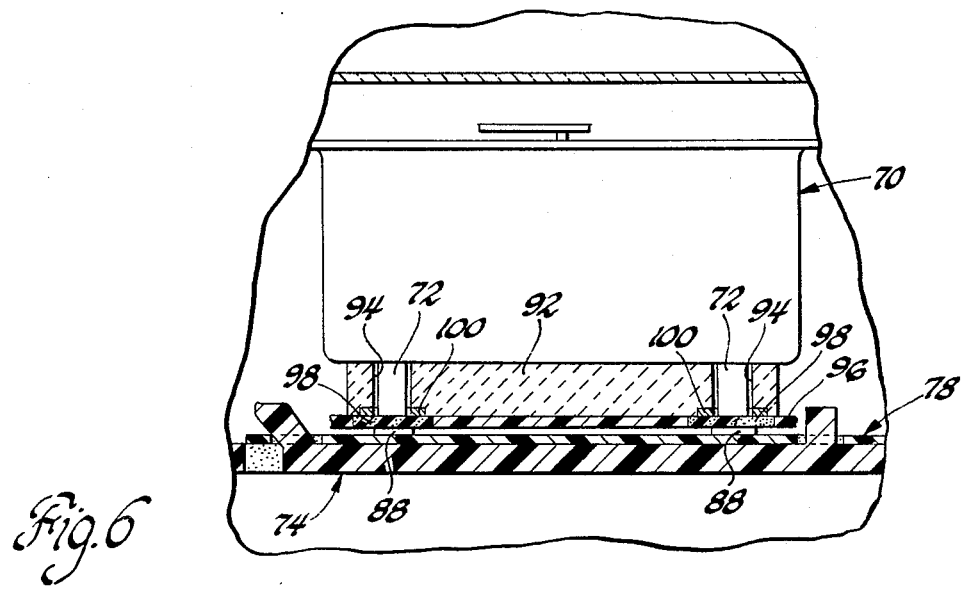

INSTRUMENT PANEL ASSEMBLY WITH CONDUCTIVE ELASTOMERIC CONNECTORS

This invention relates to a compact instrument assembly and more particularly to such an assembly for a vehicle instrument panel.

In making electrical gauges for automotive instrument panels, it is a common practice to manufacture the gauges with wide tolerances in order to achieve inexpensive fabrication and then to calibrate each gauge and match it to an external calibration resistor to achieve gauge accuracy. Typically the gauge has two or three rearwardly extending threaded terminal studs and the calibration resistor is slipped over the studs and secured in place by threaded nuts which also ensure an electrical connection between the calibration resistor terminals and the gauge terminals. A typical instrument panel has a molded polymer rear housing which carries on its rear or outer surface a flexible printed circuit for carrying electrical signals to the gauges. A clip corresponding to each gauge terminal stud is fastened to the housing to extend therethrough and makes a connection between the terminal stud and the corresponding printed circuit conductor. The terminal studs are mounted to the clips by a sliding insertion action and the gauge is secured to the instrument panel by a pair of mounting posts extending from the housing to the dial of the gauge. It is desirable to improve the efficiency of assembling the instrument panel by eliminating certain operations such as threading the nuts on the gauge terminals and applying the gauge clips to the housing. In addition it is desirable to conserve space by making the instrument assembly more compact.

It is therefore a general object of the invention to provide an instrument assembly for connecting a gauge to a supply circuit and to another component without the use of threaded fasteners and without the application of a gauge clip to the instrument panel housing. It is a further object to provide such an assembly which is more compact than traditional instrument assemblies.

The invention is carried out by providing a conductive elastomeric connector which selectively interconnects gauge terminals, calibration resistor terminals, and printed circuit conductors by a pressure connection requiring no threaded fasteners on the terminals. The invention further contemplates that the printed circuit can be incorporated inside the instrument housing for direct connection to the instrument assembly without terminal clips passing through the housing.

The above and other advantages will be made more apparent from the following specification taken in conjunction with the accompanying drawings wherein like reference numerals refer to like parts and wherein:

FIG. 3 is a detailed cross sectional view taken along lines 3—3 of FIG. 2 and depicting in detail the elastomeric conductor of FIG. 2.

FIG. 4 is a cross sectional view of an alternative form of elastomeric conductor.

FIG. 5 is a partially cross sectioned elevational view of a second embodiment of an instrument assembly according to the invention, and FIG. 6 is a partially cross sectioned elevation view of a third embodiment of an instrument assembly according to the invention.

While the instrument assembly described herein is of general application, it is particularly directed to an automotive vehicle instrument panel having several gauges and other instruments as well as illuminated legends and control elements. The disclosure is limited to a single gauge and its immediate surroundings since that is sufficient to fully reveal the invention.

Figure 1:
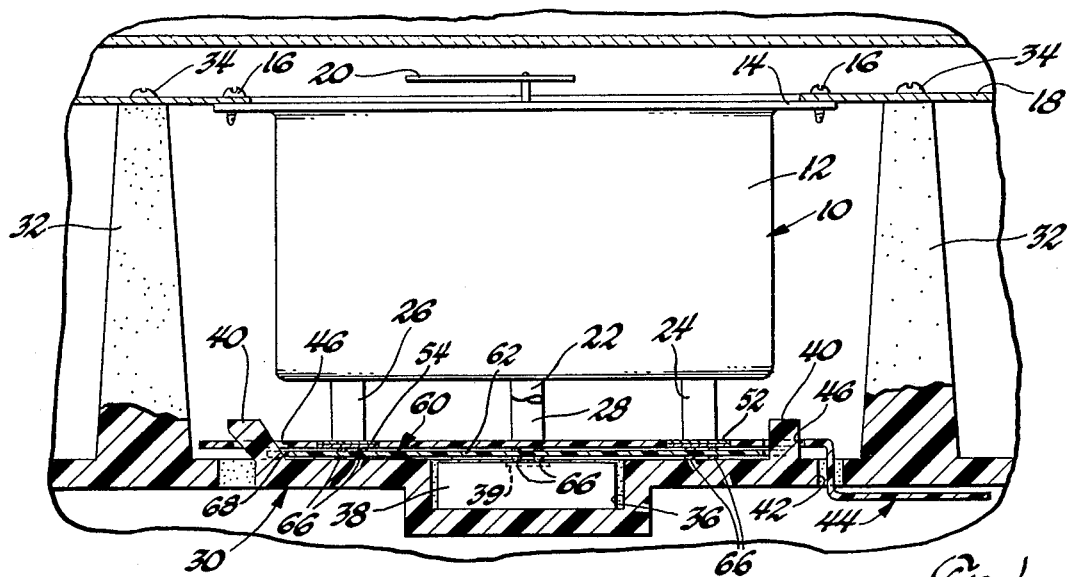
FIG. 1 is a partly cross sectioned elevational view of a portion of an instrument assembly according to the invention.
Figure 2:
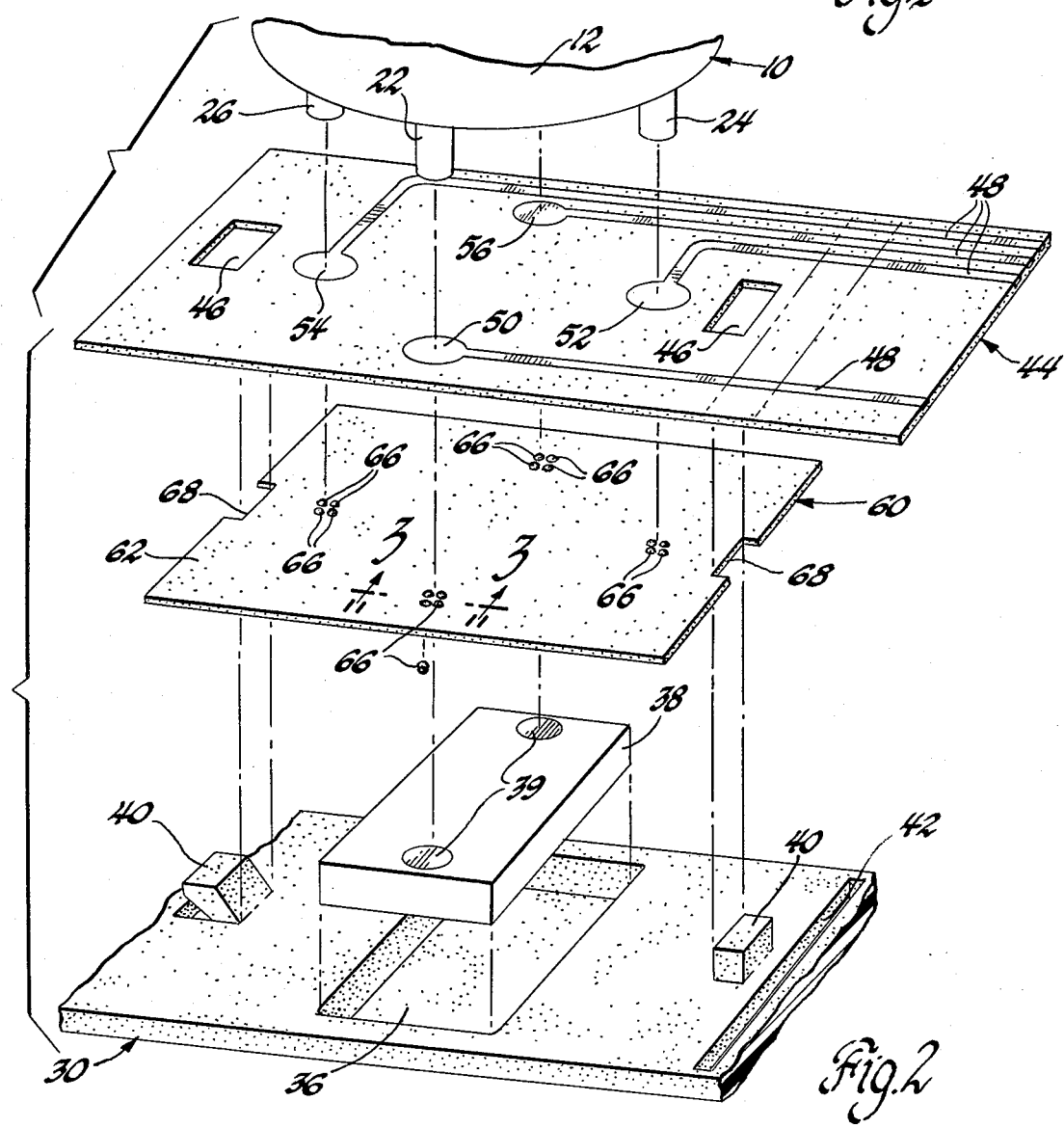
FIG. 2 is an exploded view of the assembly of FIG. 1.

Referring to FIGS. 1 and 2, an electrical instrument or gauge 10 has a housing 12 terminating in a front flange 14 which is secured by fasteners 16 to a dial 18. A pointer 20 cooperates with the dial 18 to indicate a measured value. As described thus far, the gauge 10 is of conventional structure. Four terminal studs 22, 24, 26 and 28 extend from the rear of the housing 12. The terminal studs are short and unthreaded and differ from conventional terminal studs which are long and threaded. A molded polymer housing 30 forms the back casing of the instrument panel assembly and contains a pair of integral posts 32 which extend forwardly to the dial 18 to provide a mounting surface for the gauge 10. Fasteners 34 secure the dial 18 to the ends of the posts 32. A generally rectangular well 36 in the housing 30 forms a cavity on the inner surface of the housing for receiving a calibration resistor 38. A pair of bosses 40 integral with the housing extend inwardly thereof on opposite sides of the well 36 and a slot 42 in the housing adjacent one of the bosses 40 retain a flexible printed circuit 44 which passes from the rear side of the housing through the slot 42 to the inside of the housing. The printed circuit has apertures 46 which fit over the bosses 40 and is located thereby. Conductive pathways 48 on the printed circuit 44 terminate in contact pads 50, 52, 54 and 56 which align with the four terminal studs 22–28 respectively. The printed circuit 44 is double sided and therefore has identical and interconnected contact pads 50–56 on both sides of the circuit 44. A pair of spaced terminals 39 lying in the front face of the calibration resistor 38 are aligned with the studs 22 and 28 and the contact pads 50 and 56.

Electrical interconnection between the contact pads 50 and 56 and the terminals 39 is accomplished through a conductive elastomer connector 60. As best shown in FIG. 3, the connector 60 comprises a sheet of dielectric material 62 having apertures 64 and beads 66 of conductive elastomer material molded onto the sheet 62 at the apertures and connected through the apertures. The dielectric sheet 62 is a glass filled nylon or a polyimide film for example, and the conductive beads or buttons 66 are resilient carbon filled silicone rubber. In the specific example shown in FIG. 2, the beads 66 are formed in clusters of four, each cluster being aligned with one of the contact pads 50–56. Notches 68 in the sides of the connector 60 engage the bosses 40 for locating the connector. As shown in FIG. 1, when the components just described are assembled, the studs 22 and 28 butt against the pads 50 and 56 to make contact through the pads and the connector 60 with the terminals 39 of the calibration resistor 38. Similarly the terminals 24 and 26 butt against the contact pads 52 and 54. In that case the conductive beads 66 aligned with the contact pads 52 and 54 do not serve as conductors but the resilient properties thereof are important in holding the contact pads securely against the terminals 26 to complete the electrical connection of the gauge 10 to the printed circuit 44. Thus it will be seen that the mounting post 32 must be just the right length compared to the combined dimensions of the other components to compress the conductive elastomeric beads 66 enough to secure a good electrical connection between the parts aligned with the various terminal studs and contact pads. It will also be seen that very short studs 24 can be used thereby conserving space in the instrument housing. Since pressure connections are used for electrical contact rather than threaded connectors, the assembly is completed more quickly and inexpensively than with traditional structures.

An alternative to the elastomeric connector shown in FIG. 3 is the one shown in FIG. 4 which comprises a sheet 69 of non-conductive silicone rubber having localized conductive portions 71 of silicone rubber filled with carbon or metal particles. Thus the elastomeric connector of FIG. 4 can be substituted for that used in FIGS. 1 and 2. The conductive portion 71 may be formed as a matter of design to any desired size or shape.

FIG. 5 shows an alternative form of instrument assembly comprising a gauge 70 having two rear terminals 72, and a generally planar molded polymer housing 74 with inwardly extending bosses 76 for locating a flexible printed circuit 78 which has conductors 88 on one side only and wholly lies within the housing 74. The means for attaching the gauge 70 to the housing 74 is not illustrated but is the same as that in FIG. 1. The calibration resistor 80 has a pair of terminals 82 aligned with the studs 72. A sleeve 84 of elastomer connector material is wrapped around the calibration resistor 80 and has conductive end portions 86 in contact with the resistor terminals 82 and extending around the end of the resistor to contact the printed circuit conductors 88. When the resistor 80 is placed between the gauge 70 and the printed circuit 78, the conductive end portions 86 wrap around the ends of the resistor to electrically interconnect the terminal studs 72, the resistor terminals 82 and the printed circuit conductors 88. The conductive ends 86 of the sleeve 84 are joined by non-conductive intermediate portions 90 lying above and below the resistor.

In still another embodiment of the invention shown in FIG. 6, the gauge 70, the housing 74 and the printed circuit 78 are the same as described in FIG. 5. The calibration resistor 92, however, is formed with a pair of apertures 94 which fit over the terminal studs 72. The thickness of the resistor 92 is substantially equal to the length of the terminal studs 72 so that the resistor 92 fits neatly between the ends of the studs 72 and the rear of the gauge housing. An elastomeric connector 96 has conductive portions 98 which contact the printed circuit conductors 88 and electrically connect them to the ends of the studs 72 as well as to resistor terminals 100 which surround the apertures 94 of the resistor 92. An obvious variant of this structure is to fit the resistor 92 entirely between the studs 72 so that the apertures 94 are not required. By judiciously selecting the thickness of the elastomeric connector 96, an allowable dimensional tolerance in the stack-up of parts during assembly can be achieved.

It will thus be seen that according to the principles of this invention a compact and easily manufactured instrument assembly is provided. Further by eliminating terminal clips and optionally eliminating printed circuits on the rear of the housing, assembly operations can be carried out from the inside of the housing thereby simplifying handling of the housing during the assembly operation.

The embodiments of the invention in which an exclusive property or privilege is claimed are defined as follows:

1. A compact instrument assembly having simple assembly techniques therefor comprising
   an instrument having rearwardly projecting terminals electrically connected to the instrument,
   a substantially rigid housing member positioned rearwardly of the instrument,
   an electrical component between the housing member and the instrument having terminals for electrical connection to the instrument terminals,
   a printed circuit between the housing member and the instrument having exposed conductors for selective electrical connection to the several terminals,
   elastomeric material sandwiched between the exposed conductors and selected ones of the said terminals, the elastomeric material having conductive portions positioned to selectively connect the conductors and the terminals, and
   means urging the instrument and the housing member together for compressing the elastomeric material between the said conductors and terminals to establish electrical connections therebetween.

2. A compact instrument assembly having simple assembly techniques therefor comprising
   an instrument having rearwardly projecting terminals electrically connected to the instrument,
   a substantially rigid housing member positioned rearwardly of the instrument, a recess in the housing member,
   a calibration resistor in the recess of the housing member and having terminals facing toward the instrument for electrical connection to the instrument terminals,
   a printed circuit between the housing member and the instrument having first contact pads on one side in contact with the instrument terminals, and second contact pads on the other side respectively electrically connected with the first contact pads,
   elastomeric material sandwiched between the printed circuit and the resistor, the elastomeric material having conductive portions positioned to selectively connect the second contact pads and the resistor terminals, and
   means urging the instrument and the housing member together for compressing the elastomeric material to establish electrical connections between the instrument terminals, the resistor terminals and the printed circuit contact pads.

3. The compact instrument assembly having simple assembly techniques therefor comprising
   an instrument having rearwardly projecting terminals electrically connected to the instrument,
   a substantially rigid housing member positioned rearwardly of the instrument,
   a calibration resistor between the housing member and the instrument having terminals for electrical connection to the instrument terminals and aligned therewith,
   a printed circuit between the housing member and the calibration resistor having exposed conductors for selective electrical connection to the several terminals,
   elastomeric material at least partially surrounding the resistor, the elastomeric material and the resistor being sandwiched between the exposed conductors and the instrument terminals, the elastomeric material having conductive portions selectively positioned between the instrument terminals and resistor terminals and selectively connected to the conductors, and means urging the instrument and the housing member together for compressing the elastomeric material between the said terminals and between the resistor and printed circuit to establish electrical connections therebetween.

4. A compact instrument assembly having simple assembly techniques therefor comprising an instrument having a housing and rearwardly projecting projecting terminals extending to a plane spaced a fixed distance from the rear of the housing and electrically connected to the instrument, a substantially rigid housing member positioned rearwardly of the instrument, a calibration resistor in the space between the instrument housing and the said plane and having terminals substantially in the said plane for electrical connection to the instrument terminals, a printed circuit supported on the housing member between the housing member and the instrument having exposed conductors for selective electrical connection to the several terminals, elastomeric material sandwiched between the printed circuit and the said terminals, the elastomeric material having conductive portions positioned to selectively connect the conductors and the terminals, and means urging the instrument and the housing member together for compressing the elastomeric material between the said conductors and terminals to establish electrical connections therebetween.

* * * * *